United States Patent [19]
Opris et al.

[11] Patent Number: 5,929,796
[45] Date of Patent: Jul. 27, 1999

[54] SELF-CALIBRATING REVERSIBLE PIPELINE ANALOG TO DIGITAL AND DIGITAL TO ANALOG CONVERTER

[75] Inventors: Ion E. Opris, Cupertino; Laurence Douglas Lewicki, Sunnyvale; Lee Stoian, Santa Clara, all of Calif.

[73] Assignee: National Semiconductor Corporation, Santa Clara, Calif.

[21] Appl. No.: 08/841,100

[22] Filed: Apr. 29, 1997

[51] Int. Cl.[6] .................................................. H03M 1/10
[52] U.S. Cl. ......................... 341/120; 341/108; 341/172
[58] Field of Search .................................. 341/108, 110, 341/120, 161, 162, 172

[56] References Cited

U.S. PATENT DOCUMENTS

| | | | |
|---|---|---|---|
| 3,449,741 | 6/1969 | Egerton, Jr. .............................. | 341/108 |
| 3,906,488 | 9/1975 | Suarez-Gartner ....................... | 341/108 |
| 4,056,820 | 11/1977 | Höfer ..................................... | 340/347 |
| 4,112,427 | 9/1978 | Höfer et al. ............................. | 340/347 |
| 4,162,376 | 7/1979 | Hirschmann et al. ............. | 179/18 BC |
| 4,291,298 | 9/1981 | Carbrey ................................. | 340/347 |
| 4,385,286 | 5/1983 | Haque .................................... | 341/127 |
| 4,622,536 | 11/1986 | Shih et al. .............................. | 341/108 |
| 4,908,620 | 3/1990 | Fujisawa ................................. | 341/108 |
| 5,043,732 | 8/1991 | Robertson et al. ..................... | 341/156 |
| 5,258,759 | 11/1993 | Cauwenberghs et al. ............. | 341/150 |
| 5,274,377 | 12/1993 | Matsuura et al. ....................... | 341/161 |
| 5,373,292 | 12/1994 | Yasuda ................................... | 341/108 |
| 5,416,845 | 5/1995 | Lee ......................................... | 341/172 |
| 5,668,549 | 9/1997 | Opris et al. ............................. | 341/118 |

OTHER PUBLICATIONS

Seung–Hoon Lee, et al., "Digital–Domain Calibration of Multistop Analog–to Digital Converter", IEEE Journal of Solid–State Circuits, vol. 27, No. 12, Dec. 1992.

Andrew N. Karanicolas, et al., "A 15–b 1–Msample/s Digitally Self–Calibrated Pipeline ADS", IEEE Journal of Solid–State Circuits, vol. 28, No. 12, Dec. 1993.

*Primary Examiner*—Marc S. Hoff
*Attorney, Agent, or Firm*—Limbach & Limbach LLP; Seong-Kun Oh

[57] ABSTRACT

A self-calibrating reversible pipeline analog to digital converting architecture configured to convert an input analog signal to an output digital signal and further to convert an input digital signal to an output analog signal is disclosed. The reversible pipeline architecture self-calibrates to compensate for adverse effects upon the linearity during signal conversion using a digital correction procedure. The same digital correction coefficients are used during both analog to digital conversion as well as during digital to analog conversion. The self-calibrating reversible converting architecture includes a reduced gain stage to create the necessary redundancy for the digital correction. Furthermore, the self-calibrating reversible converting architecture includes an overflow reduction stage to generate redundancy for the digital correction.

8 Claims, 8 Drawing Sheets

SELF-CALIBRATING REVERSIBLE PIPELINE ANALOG TO DIGITAL AND DIGITAL TO ANALOG CONVERTER

BACKGROUND OF THE INVENTION

1. Field of the Invention

The present invention relates to the field of analog-to-digital (A/D) converters. More particularly, the present invention relates to a digitally self-calibrating A/D algorithmic converter architecture including pipeline architecture that functions both as an A/D and a D/A converter.

2. Description of the Related Art

Analog to digital converters with pipeline architecture are well suited for low-power, high speed applications. Among the several of the currently used high conversion speed techniques such as flash, multi-step, pipeline, interpolating, and time-interleaved successive approximation, the pipeline technique offers the best trade-off between minimizing circuit complexity, silicon area, and power consumption with respect to conversion speed. The pipeline architecture can generally provide high throughput rates and occupy small die areas which are both desirable and cost efficient in A/D converters. These advantages result from the concurrent operation of each of the multiple stages in the pipeline architecture.

Broadly speaking, at any given time during the operation of the pipeline A/D converter, the first stage operates on the most recent sample inputted while subsequent stages in the pipeline architecture concurrently operate on residues from the previous samples outputted from prior stages of the cascaded pipeline architecture.

A typical M-bit/stage pipeline A/D converter consists of N, M-bit/stages, where N represents the number of stages in the pipeline architecture, and further, where N*M=K. For example, a pipeline A/D converter architecture made up of five stages (N=5) with each stage producing 2 bits (M=2) will result in a 10 bit A/D converter (K=10).

Figure 1:
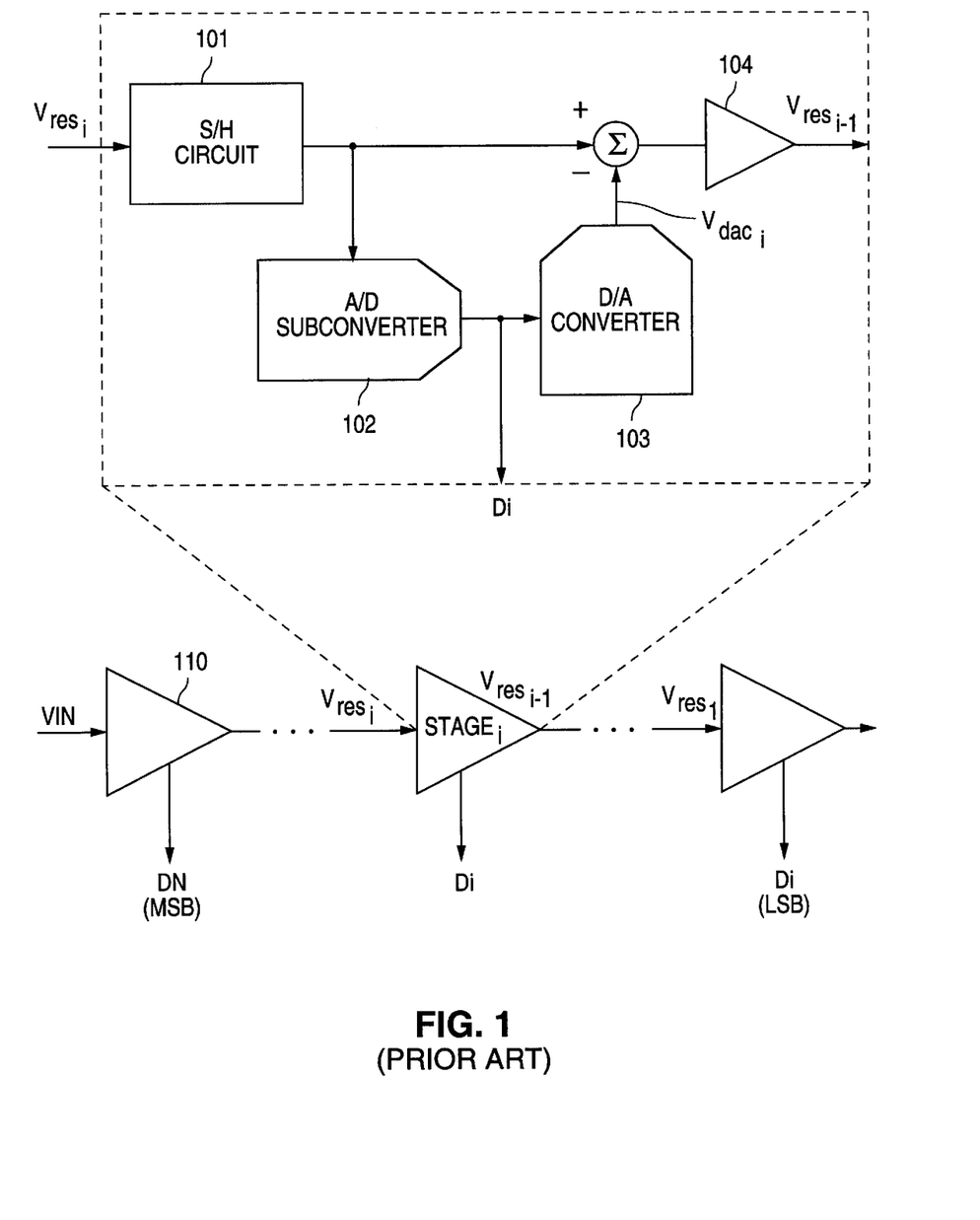
FIG. 1 illustrates a block diagram of a conventional N bit pipeline A/D converter.

FIG. 1 shows the general architecture of a K-bit pipeline A/D converter. At stage i, the analog input Vresi (the residue from the previous stage) is converted into a digital representation $D_i$ with an A/D subconverter and the analog residue $Vres_{i-1}$, is computed and passed to the next stage (i−1). In other words, the analog input is sampled and held at a sample and hold circuit 101. The result is converted to an M-bit digital code $D_i$ by an analog to digital subconverter 102. The first stage of the pipeline architecture produces an M-bit representation $D_N$ which are the most significant bits (MSB) of the final digital output. Then, this M-bit digital code $D_N$ is used by a local digital to analog converter 103 to create an analog equivalent of the M-bit digital code $D_N$. This analog equivalent $Vdac_i$ is subtracted from the output of the sample and hold circuit 101 to produce an analog residue. The resulting analog residue is subsequently amplified by an amplification factor of $2^M$ by an amplifier 104 and sent to the next stage (i−1) of the pipeline architecture as the input signal $Vres_{i-1}$ of the subsequent (i−1)th stage. The residue signal $Vres_{i-1}$ can be calculated by the following expression.

$$Vres_{i-1}=2^M*(Vres_i-Vdac_i) \qquad (1)$$

for i=n, . . . , 1. As can be seen from equation (1), because the residue at each stage is multiplied by $2^M$, each successive stage has the same range of input voltages rather than having that range geometrically decreasing toward zero. If the local D/A converter in each stage is linear, the D/A converter output $Vdac_i$ at each stage i can be represented by the following expression.

$$Vdac_i=D_i*2^{-M}*Vref \qquad (2)$$

Where Vref is the reference signal applied uniformly to each stage of the pipeline architecture. The multiplied factor ($D_i*2^{-M}$) then represents a fraction of the reference signal Vref which has already been encoded and is to be subtracted from the analog remainder $Vres_i$.

If M=1, (i.e., each stage produces 1 bit) the D/A converter in each stage only has two possible output signal levels. Then, this D/A conversion will always be linear. This 1-bit/stage implementation is very attractive since the A/D subconverter can be implemented with a simple comparator. Given the inherent linearity of the D/A converter, the overall linearity of the A/D converter will be determined only by the comparator offsets and the stage gain errors. For such conversion stage having a nominal gain of 2, equations (1) and (2) can be simplified to the following residue expression.

$$Vres_{i-1}=2 \cdot Vres_i - D_i Vref \qquad (3)$$

In an ideal case, the digital representation of an input voltage $V_{IN}$ for the A/D converter is given by the following expression.

$$V_{IN} = Vref \sum_{i=1}^{N} \frac{D_i}{2^{N+1-i}} \qquad (4)$$

For example, in a case where N=5, Equation (4) approximates to Vref*(½+¼+⅛+1/16+1/32), or Vref*(31/32). The digital representation of the input voltage $V_{IN}$ is then "11111" corresponding to $D_5, D_4, D_3, D_2, D_1$.

Figure 2:
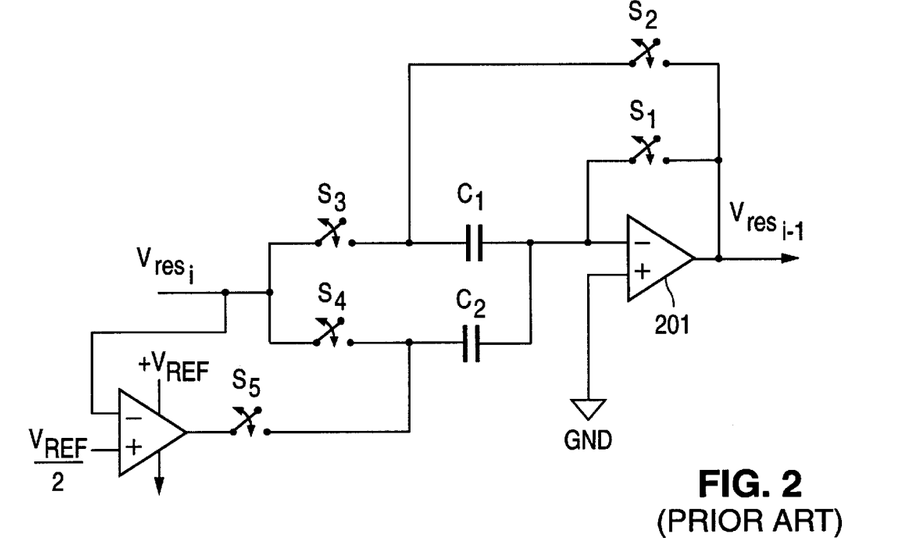
FIG. 2 illustrates a conventional 1-bit/stage analog residue computation circuit.

The digital code $D_i$ of each stage in equation (4) can take one of two values: 0 or +1. For the input residue signal $Vres_i$ larger than Vref/2, the digital output code $D_i$ is +1. For the input residue signal $Vres_i$ less than Vref/2, the digital output code $D_i$ is 0. This can be achieved by a simple circuit as shown in FIG. 2 illustrating a switched capacitor circuit implementing Equation (1). The switching arrows for switches $S_1-S_5$ indicate a "sample" and a "hold" phases for the 1-bit per stage analog residue computation circuit.

Figure 3A:
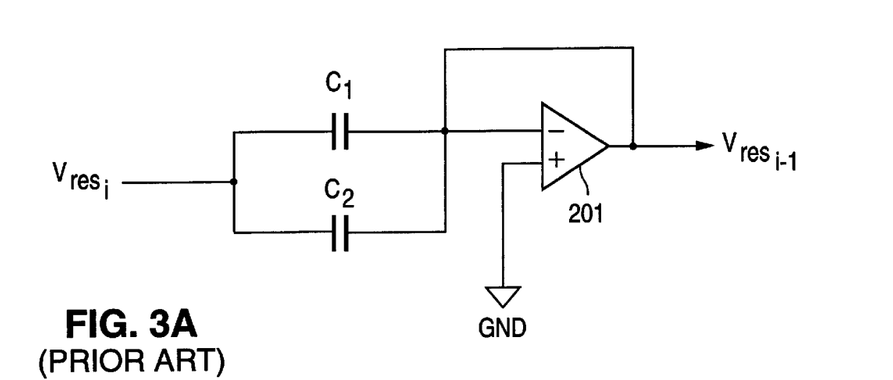
FIG. 3A illustrates a sample phase of one stage of the conventional 1-bit/stage analog residue computation circuit of FIG. 2.

FIG. 3A illustrates the sample phase of FIG. 2 where switches $S_1$, $S_3$, and $S_4$ are closed while switches $S_2$ and $S_5$ are open. This switching configuration ensures that the i-th stage input signal $Vres_i$ is sampled across capacitors $C_1$ and $C_2$ thereby charging both capacitors to a voltage of $Vres_{i-1}$. Then, the capacitor stored voltage $Vres_{i-1}$, is compared with Vref/2 producing the digital output code $D_i$.

Figure 3B:
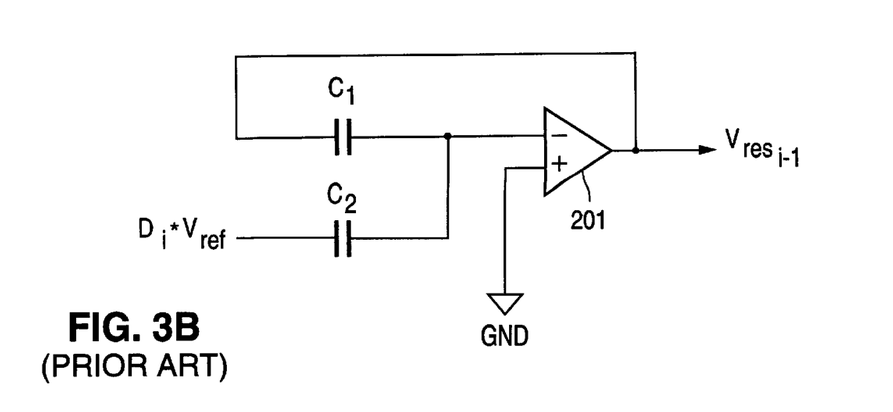
FIG. 3B illustrates a hold phase of one stage of the conventional 1-bit/stage analog residue computation circuit of FIG. 2.

FIG. 3B illustrates the hold phase of the circuit in FIG. 2 where switches $S_2$ and $S_5$ are closed while switches $S_1$, $S_3$, and $S_4$ are open. This switching configuration couples capacitor $C_2$ to $D_i*Vref$, while capacitor $C_1$ is connected to the output of the operational amplifier 201. If capacitors $C_1$ and $C_2$ are assumed to have equal capacitances, this connection ensures that the output of the operational amplifier $Vres_{i-1}$ is equal to the desired residue as according to equation (3).

In practice, mismatches in the capacitors $C_1$ and $C_2$ and charge injection from switch $S_1$ introduce errors in the transfer characteristic and linearity errors in the digital representation. These errors can be compensated with a digital self-calibration and digital correction techniques.

Conventional self-calibration and digital correction techniques are discussed in S. H. Lee et al., "Digital-Domain Calibration of Multistep Analog-to-Digital Converters", IEEE J. Solid-State Circuits, vol. 27, No. 12 at pp. 1679–1688, December 1992, and in A. Karanicolas et al., "A 15-b 1M-sample/s Digitally Self-Calibrated Pipeline ADC", IEEE J. Solid-State Circuits, vol. 28, No.12 at pp. 1207–1215, December 1993. According to these calibration methods, each transition is calibrated starting with the lower significant bits, i.e., the least significant bit (LSB), and then advancing toward the most significant bit (MSB). Correction coefficients are stored in memory locations $mem_i$ associated with each digital data bit $D_i$.

The final input digital conversion code ($C_{DS}$) is then obtained from the following expression.

$$C_{DS} = \sum_{i=1}^{N} D_i \cdot CC_i - \text{Offset} \quad (5)$$

Where Offset is the overall signal offset of the entire pipeline architecture.

Additionally, in order for the digital correction to work according to the above conventional approaches, some redundancy needs to be introduced in the system, either using reduced gain stages or residue overflow reduction stages. Furthermore, the conversion from the input digital code $C_{DI}$ to the corresponding digital bit representation $D_i$ (for i=1, ... N) adds to the latency, but usually this latency is not a major concern in an algorithmic (cyclic or pipeline) converter.

Figure 4:
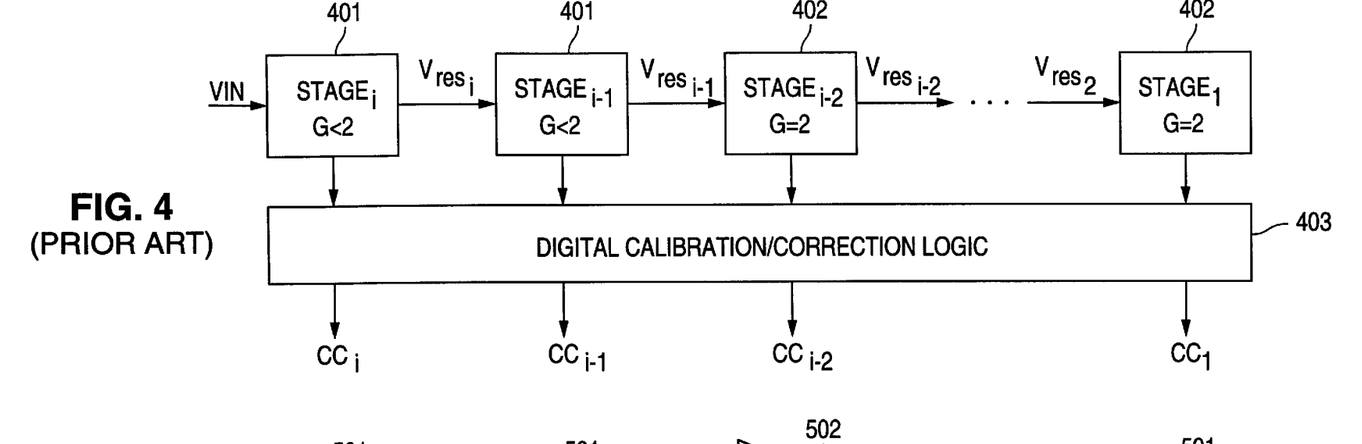
FIG. 4 illustrates a block diagram of a conventional self-calibrating A/D converter architecture with reduced gain stages.

FIG. 4 illustrates a conventional digital self-calibrated A/D pipeline converter with reduced gain stages. As shown, stages 401 are set with nominal gains of less than 2 while stages 402 are set to nominal gains of 2. The calibration by a digital calibration/correction logic 403 starts at the stage 401 with the nominal gain of less than 2 constituting the least significant bit (for example, stage (i–1)), and continues through to stage (i). Additionally, the digital calibration/correction logic 403 generates correction coefficients $CC_i$ for each stage (1) through (i) of the converter. The value of the reduced gain is selected to ensure sufficient gain reduction such that the residue at from each stage never exceeds the reference boundary in the worst case when the maximum capacitor mismatch, comparator offset, and charge injection error magnitudes compound. In other words, it is crucial to use a nominal gain of less than 2 such that the output of each stage never exceeds the boundaries of set by the upper and lower reference voltages.

Figure 5:
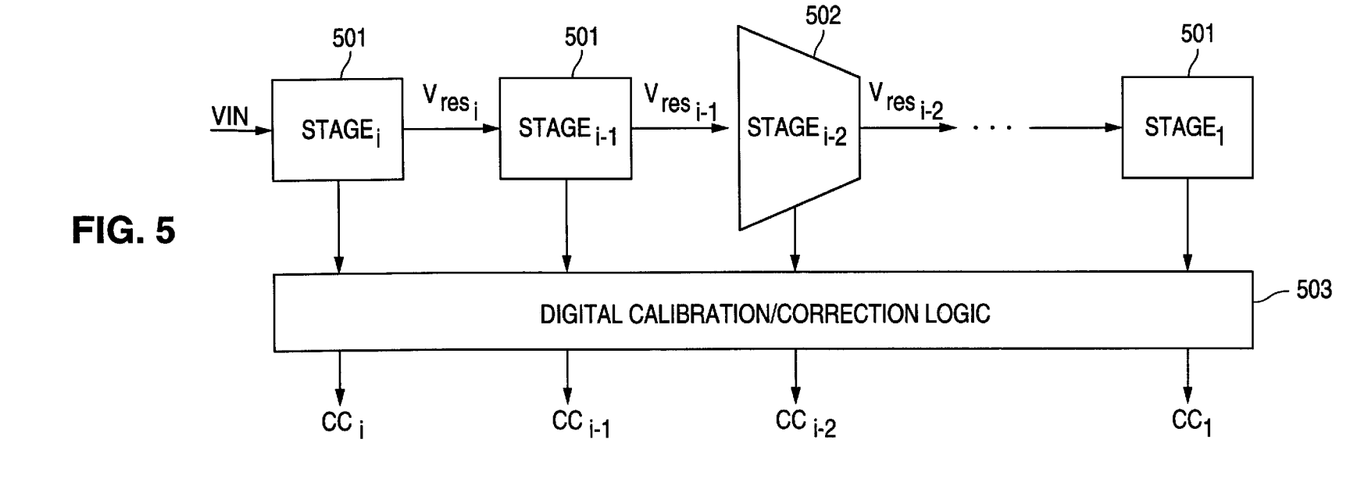
FIG. 5 illustrates a block diagram of a self-calibrating A/D converter architecture with overflow reduction stages.

FIG. 5 illustrates a self-calibrating pipeline A/D converter architecture with residue overflow stages as discussed in co-pending, commonly assigned patent application Ser. No. 08/337,253, filed Nov. 10, 1994, and entitled "Radix 2 Architecture and Calibration Technique for Pipeline Analog to Digital Converters," the disclosure of which is incorporated herein by reference. In this approach, an overflow reduction stage 502 is placed at a predetermined interval between the other stages 501 of the pipeline architecture such that overflow errors occurring in the manufacturing process used for producing the converter are compensated. Again, a digital calibration/correction logic 503 generates correction coefficients $CC_i$ corresponding to each stage (from (1) to (i)) of the converter architecture. The exact sequence of the overflow stages is not critical as long as there are enough to avoid the aforementioned problem. The overflow reduction calibration logic 502 operates in a similar manner to the digital calibration logic 501 except that in the overflow reduction calibration logic 502, upper and lower correction coefficients $CC_{i-2(L)}$ and $CC_{i-2(H)}$ are used to maintain the calibration within the operable range.

As a matter of design, however, it is desirable to place the overflow reduction stages in the converter to avoid the possibility of any out of range input multiplying enough to reach the power supply voltage before that residue is brought back into the appropriate input range by an overflow reduction stage. This can be achieved by assuming the worst case overflow for a stage and ascertaining the maximum out of range of any stage operation before the output becomes non-linear.

All of the above-mentioned approaches were previously limited to analog to digital converters. To convert a digitized signal into analog form requires, under the conventional approach, added circuitry which necessarily entails added complexity, component matching problems, and higher manufacturing cost.

Component matching is of particular importance because matched characteristics of the elements in the converter determine the converter's attainable accuracy. Conventional devices that require separate architectures for both A/D conversion and D/A conversion will include added complexity as compared to architectures designed solely for A/D conversion or D/A conversion.

To minimize the number of necessary steps for conversion, it would be desirable to have a pipeline A/D converter architecture which uses the same correction coefficients during the A/D and D/A conversions. Therefore, given the advantages of a pipeline structure for A/D converters outlined above, it would be desirable to have a self-calibrating reversible pipeline A/D and D/A converter architecture which performs A/D and D/A conversions using the same architecture and the same calibrating variables.

SUMMARY OF THE INVENTION

The present invention is generally directed to a self-calibrating reversible A/D and D/A converter architecture applicable to all algorithmic structures including pipeline and cyclic converters, and, in particular, for switched capacitor applications used for both A/D conversion and D/A conversion. According to the present invention, the same correction coefficients $CC_i$ are used in both the A/D and the D/A conversions.

According to one embodiment of the present invention, there is provided an apparatus including a converter circuit for use in a self-calibrating reversible analog to digital and digital to analog converter, where the converter circuit includes an amplifier, a plurality of capacitances coupled to said amplifier, a first reference signal port configured to receive a first reference signal, a first signal port configured to receive an analog signal, a second signal port configured to receive a digital signal, and a plurality of switches configured to receive a plurality of switch control signals which includes first and second switch control signal states and in accordance therewith selectively couple the amplifier, the plurality capacitances, the first reference signal port and the first and second signal ports; where during the first control signal state the analog signal is converted to the digital signal and during the second control signal state the digital signal is converted to the analog signal.

A converting method according to another embodiment of the present invention for use in a self-calibrating reversible analog to digital and digital to analog converter includes receiving a first reference signal via a first reference signal port, receiving an analog signal via a first signal port, receiving a digital signal via a second signal port, and receiving a plurality of switch control signals which includes first and second switch control signal states and in accordance therewith selectively coupling an amplifier, a plurality capacitances, said first reference signal port and said first and second signal ports, wherein during said first control signal state said analog signal is converted to said digital signal and during said second control signal state said digital signal is converted to said analog signal.

A method of generating a plurality of digital bits representing a digital signal in digital to analog conversion for use in a reversible analog to digital and digital to analog converter according to yet another embodiment of the present invention, the method comprising the steps of initializing a digital signal and comparing the digital signal with a coefficient such that for each stage of a reversible converter architecture, a digital bit corresponding to the stage is set to 1 and a global offset is subtracted from the digital signal when the digital signal is larger than the correction coefficient, and further, where the digital bit corresponding to said stage is set to 0 when said digital signal is smaller than the correction coefficient.

These and other features and advantages of the present invention will be understood upon consideration of the following detailed description of the invention and the accompanying drawings.

DETAILED DESCRIPTION OF THE INVENTION

Figure 6:
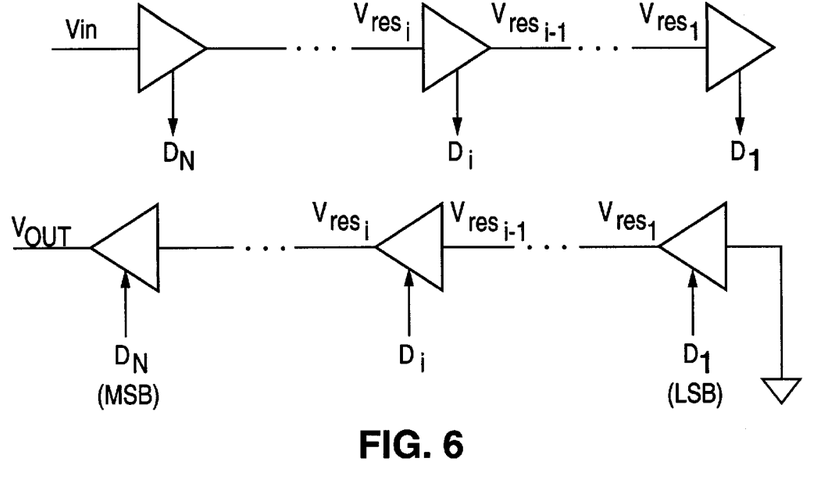
FIG. 6 illustrates a conceptual block diagram of a reversible A/D and D/A conversion architecture according to the present invention.

FIG. 6 shows a block diagram of the conceptual approach to the reversible pipeline A/D and D/A converting architec-ture and technique according to the present invention. Broadly speaking, the D/A conversion using the pipeline A/D converter architecture is executed by reversing all the analog to digital conversion operations. In particular, with an input voltage $V_{IN}$ corresponding to a digital code $C_{DI}$ (where $C_{DI}$ is the output digital representation of the input signal) the A/D conversion is given by Equation (4), with the internal digital representation $D_i$, and the analog residues $Vres_i$ where $i=N, \ldots, 1$.

Figure 7:
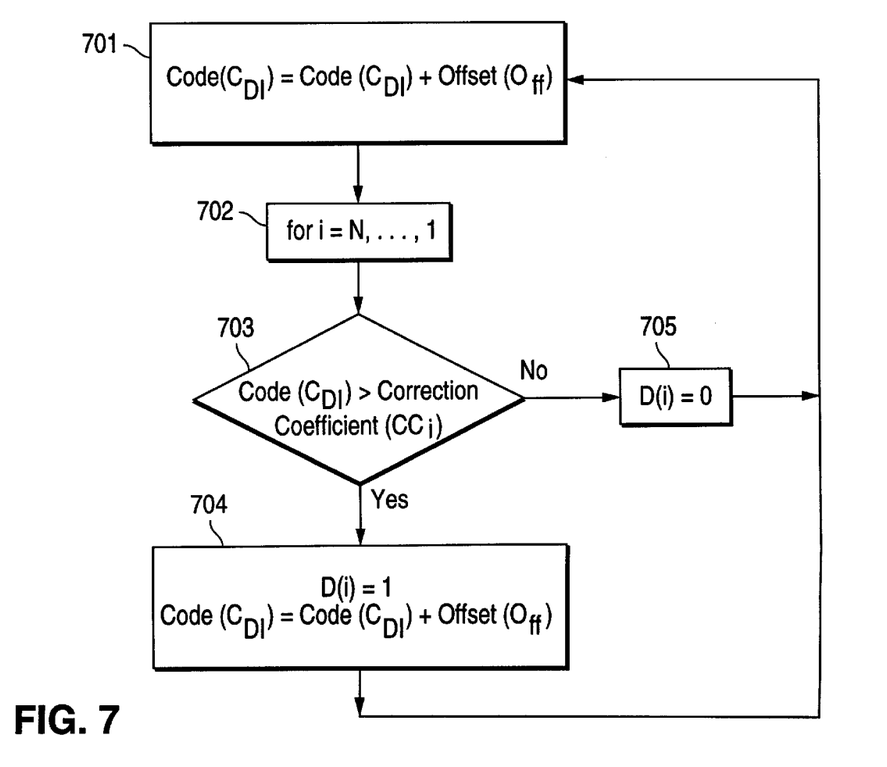
FIG. 7 illustrates a block diagram of an algorithm for obtaining digital data bits at each stage of the converter architecture from a digital input.

In the D/A conversion, from the input digital code $C_{DI}$, the raw digital data bits $D_i$ for each (i) are calculated using the steps shown in FIG. 7 which is discussed below.

At step 701, the input digital code $C_{DI}$ is initialized by an offset $O_{FF}$ which represents the overall offset of the converter during analog to digital conversion. Then, an iterative process is implemented as described below. An iteration for each stage of the converter architecture ($i=N, \ldots 1$) is implemented at step 702 where N equals the number of stages in the pipeline architecture of the reversible converter.

In particular, at step 703, the input digital code $C_{DI}$ is compared with an i-th correction coefficient $CC_i$ stored at a memory location $mem_i$ at that stage. If the input digital code $C_{DI}$ is larger than the i-th correction coefficient $CC_i$, then a corresponding i-th digital bit $D_i$ is set to +1, and the i-th correction coefficient $CC_i$ is subtracted from the input digital code $C_{DI}$ at step 704. If, however, at step 703, the input digital code $C_{DI}$ is less than the i-th correction coefficient $CC_i$, then the corresponding i-th digital bit $D_i$ is set to 0 at step 705.

This procedure is repeated until the complete digital bit string $D_i$ for $i=N, \ldots 1$, corresponding to the input digital code $C_{DI}$ is composed.

Also, each analog stage is reversed such that in the analog domain, it performs the inverse operation of Equation (1), which, in the ideal case, is described by the following expression.

$$Vres_i = \frac{(Vres_{i-1} + D_i \cdot Vref)}{2} \qquad (6)$$

Therefore, at each i-th stage (for $i=N, \ldots, 1$), the input analog residue $Vres_i$ has the same value as in the A/D conversion of $V_{IN}$, and the output voltage $V_{OUT}$ ($=V_{IN}$) has a corrected value corresponding to the input digital code $C_{DI}$. This algorithm ensures that the same correction coefficients used in the A/D calibration are used also in the D/A conversion.

Figure 8:
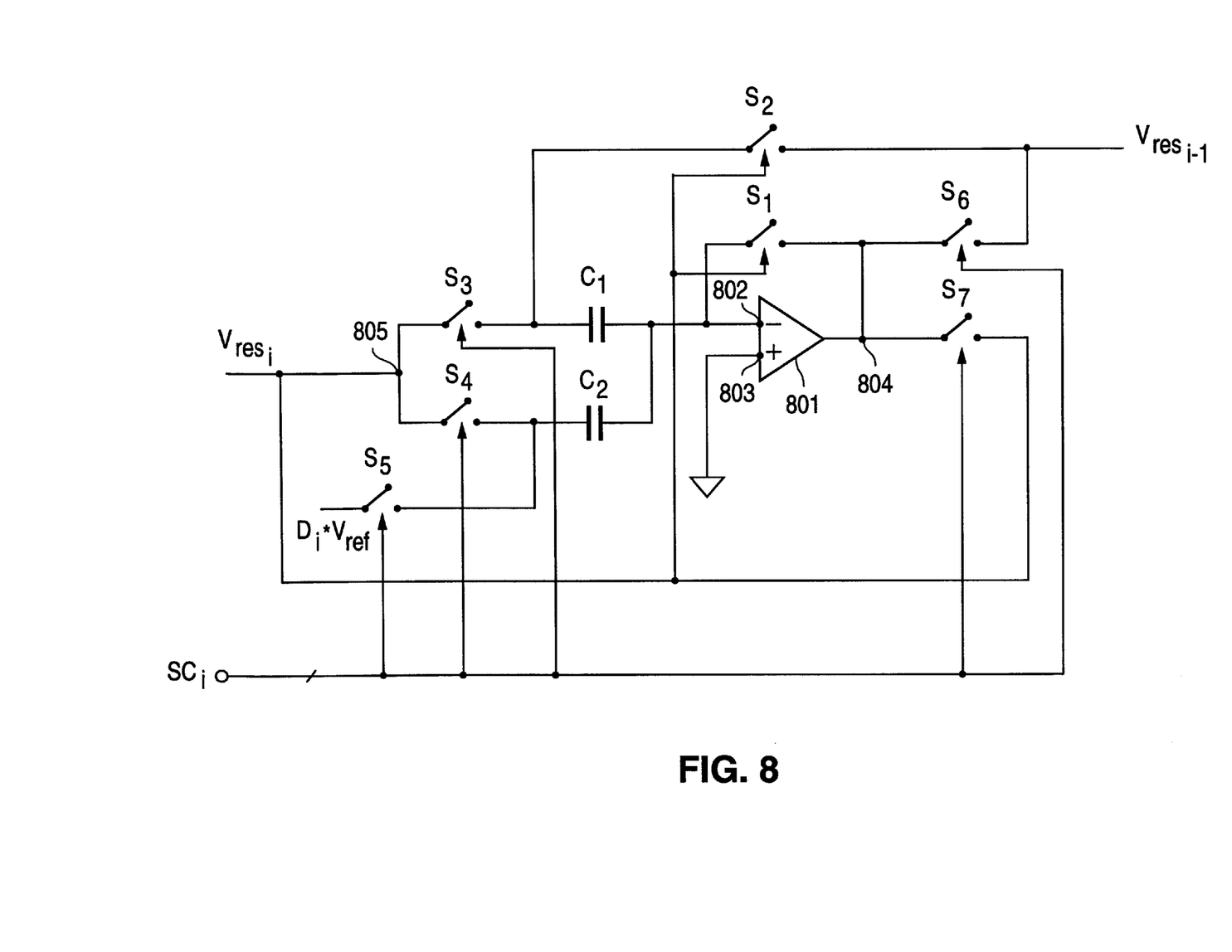
FIG. 8 illustrates one stage of a reversible 1-bit/stage A/D or D/A converter architecture according to the present invention.

FIG. 8 illustrates one embodiment of the reversible A/D and D/A converter architecture according to the present invention. In particular, FIG. 8 show a schematic for a reversible 1-bit per stage pipeline A/D converter architecture.

During the A/D conversion, the several switches shown in FIG. 8 are selectively open and closed in the following manner. During the sampling period, switches $S_1$, $S_3$, $S_4$ and $S_6$ are closed while the remaining switches are open. The above described switching configuration allows the input signal $Vres_i$ to be sampled across the capacitors $C_1$ and $C_2$, while the output node 804 of the amplifier 801 is connected to the input node 802 of the amplifier 801. It should be noted that the noninverting input 803 of the amplifier 801 is connected to a common ground GND. This configuration ensures that the input signal $Vres_i$ is sampled across the two capacitors $C_1$ and $C_2$.

During the hold phase of the A/D conversion, switches $S_2$, $S_5$ and $S_6$ are closed while switches $S_1$, $S_3$, $S_4$ and $S_7$ are open. This configuration allows the capacitor $C_2$ to be connected to either +Vref or ground depending on the value of the digital output code $D_i$. For example, if the digital output code $D_i$ is 1, then, the capacitor $C_2$ is connected to Vref. Otherwise, if the digital output code $D_i$ is zero, then the capacitor $C_2$ is connected to ground. The resulting residue signal $Vres_{i-1(A/D)}$ is outputted from the amplifier 801 and inputted to the next stage of the pipeline architecture.

During the D/A conversion, the operation of switches $S_6$ and $S_7$ are reversed as compared to the switching configuration thereof during the A/D conversion operation. In particular, during the D/A conversion operation, switch $S_6$ remains open while switch $S_7$ is closed. During the sampling period of the D/A conversion, in addition to switch $S_7$, switches $S_1$, $S_2$ and $S_5$ are closed, while switches $S_3$ and $S_4$, in addition to switch $S_6$, remain open. Then, the output residue signal $Vres_{i-1}$ which is now the input to this i-th stage, is sampled across the capacitor $C_1$ while the multiplied factor $D_i*Vref$ is sampled across the capacitor $C_2$. Switches $S_1$ and $S_7$ ensure that the amplifier 801 is bypassed and the signal is channeled to the A/D conversion stage input node 805 which is now the output node for the D/A conversion stage.

During the hold period for the D/A conversion operation, switches $S_3$, $S_4$ and $S_7$ are closed while switches $S_1$, $S_2$, $S_5$ and $S_6$ are open. Again, it can be seen that switches $S_6$ and $S_7$ do not change during the two non-overlapping periods of the D/A conversion operation. In this manner, an input digital signal word can be converted to an analog output signal using the same pipeline architecture.

The following table illustrates the switching configuration during the sample phase and the hold phase for both A/D and D/A conversions.

TABLE 1

Switching Configuration for the reversible 1-bit stage

| Phase | $S_1$ | $S_2$ | $S_3$ | $S_4$ | $S_5$ | $S_6$ | $S_7$ |
|---|---|---|---|---|---|---|---|
| A/D Sample | X | O | X | X | O | X | O |
| A/D Hold | O | X | O | O | X | X | O |
| D/A Sample | X | X | O | O | X | O | X |
| D/A Hold | O | O | X | X | O | O | X |

(X indicates closed switches and O indicates open switches.)

For the A/D conversion of the reversible pipeline converter of FIG. 8, the charge balancing equation is:

$$\frac{Vres_{i-1} \cdot ((A+1) \cdot C_1 + C_2)}{AC_1} = Vres \cdot \frac{1+C_2}{C_1} - D_i \cdot Vref \frac{C_2}{C_1} - \frac{Q_{SW}}{C_1} \quad (7)$$

Where A is the open loop gain of the operational amplifier 801, and $Q_{SW}$ is the charge injection from switch $S_1$. During the D/A conversion, the transfer function is given by the following expression.

$$\frac{Vres \cdot (A+1)}{A} = \frac{Vres_{i-1} \cdot C_1}{(C_1+C_2)} + D_i Vref \cdot \frac{C_2}{(C_1+C_2)} - \frac{Q_{SW}}{(C_1+C_2)} \quad (8)$$

If the op amp open loop gain A is high enough to be neglected ($A>>2^N$), equations (5) and (6) can be reduced to the following equivalent relation.

$$Vres_i \times (C_1+C_2) = Vres_{i-1} \times C_1 + D_i \times Vref \times C_2 \pm Q_{SW} \quad (9)$$

The ± sign for the charge injection term $Q_{SW}$ shows that the charge injection effect is not reversed from the A/D to the D/A configuration. However, in the context of the obtaining raw digital data representative of each stage of the converter, as previously described (FIG. 7), the charge injection error contributes only as a global offset (offset), and does not affect the overall linearity. To cure this, a single global calibration can be used for the D/A conversion to calibrate for this global shift. This calibration can be done with the calibrated A/D structure previously calibrated for global offset. Furthermore, the D/A offset coefficient will be different from the A/D offset, so another memory location can be assigned for this offset.

The errors due to the finite op amp gain do, in fact, affect the linearity of the converter. As previously mentioned, high gain is needed for the equivalent relation as expressed in Equation (7) to hold, and thereby allow A/D calibration coefficients to be used during the D/A conversion. For example, with a 10-bit reversible pipeline converter, the errors are negligible with an op amp gain of about 80 dB.

Figure 9:
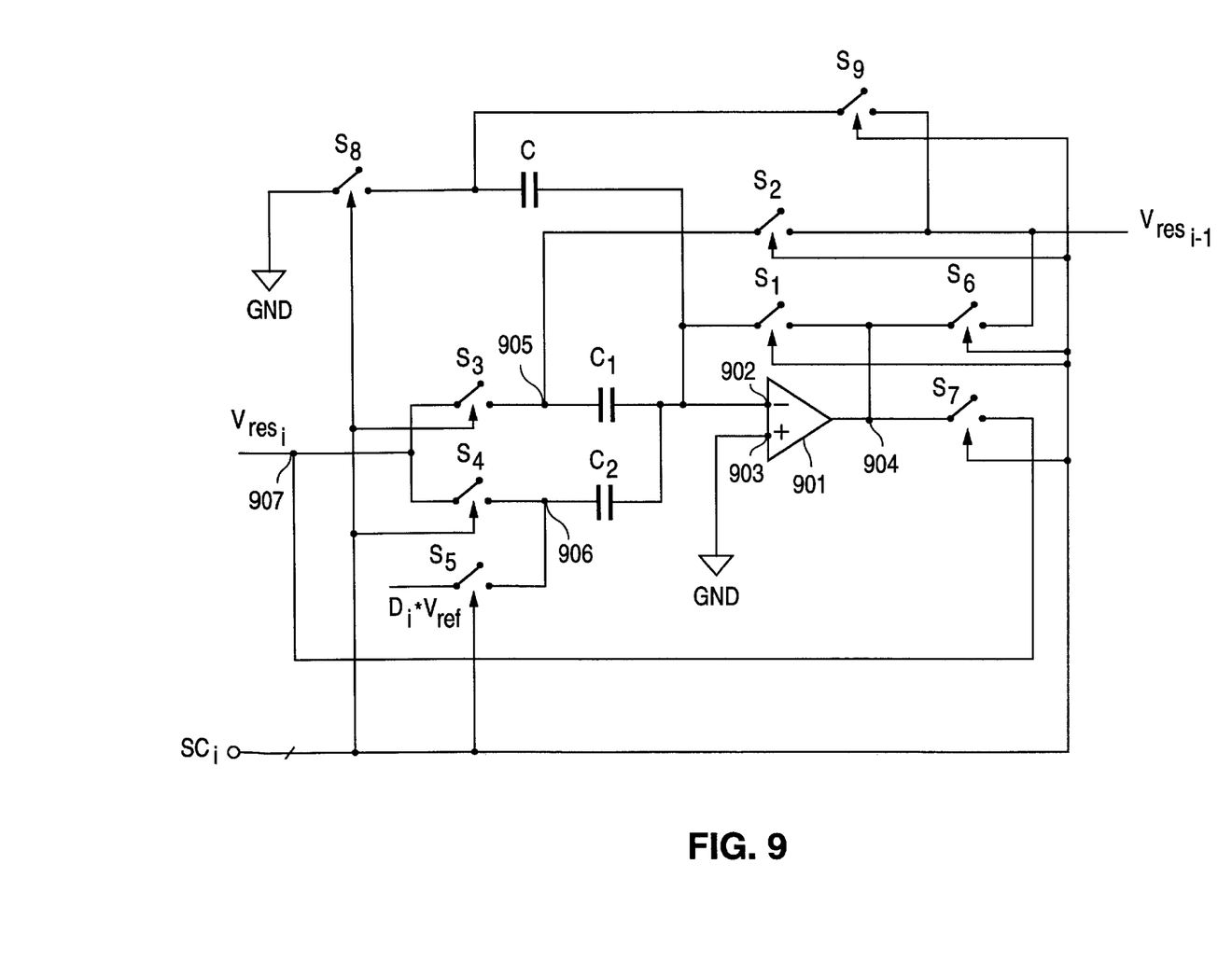
FIG. 9 illustrates a reduced gain stage of a reversible A/D converter architecture according to the present invention.

FIG. 9 illustrates an embodiment of the present invention including a reversible reduced gain stage to create the necessary redundancy for the digital correction. A capacitor C is coupled between the input node 902 of the amplifier 901 and a ground reference node GND. The net result is that the gain for this stage is effectively reduced. As explained below, the reversibility of the pipeline architecture of FIG. 9 is obtained with the extra two switches $S_8$ and $S_9$ and the following switching sequence.

During the sampling period of the A/D conversion, switches $S_1$, $S_3$, $S_4$, $S_6$ and $S_8$ are closed while switches $S_2$, $S_5$, $S_7$ and $S_9$ are open. This configuration permits the input signal $Vres_i$ to be sampled across capacitors $C_1$ and $C_2$. In addition, the inverting input node 902 of amplifier 901 is coupled to the output node 904 of the same amplifier 901. The non-inverting input 603 of the amplifier 901 is connected to a common ground GND. Finally, the capacitor C is coupled to the input node 902 of the amplifier.

During the hold period for the A/D conversion, switches $S_2$, $S_5$, $S_6$, and $S_9$ are closed while switches $S_1$, $S_3$, $S_4$, $S_6$ and $S_8$ are open. During the sampling period of the D/A conversion, switches $S_1$, $S_2$, $S_5$, $S_7$ and $S_9$ are closed while switches $S_3$, $S_4$, $S_6$ and $S_8$ are open. During the hold period of the D/A conversion, switches $S_3$, $S_4$, $S_7$ and $S_8$ are closed while switches $S_1$, $S_2$, $S_5$, $S_6$ and $S_9$ are open. As a result the i-th stage input port 907 is connected to the output node 904 of the amplifier 901 while the capacitor C, rather than being coupled between the input node 902 and the output node 904 of the amplifier 901, is now coupled between the input node 902 of the amplifier 901 and the common ground GND.

It should be noted that switches $S_6$ and $S_7$ are turned on and off, respectively, simultaneously in accordance with whether the architecture is performing A/D or D/A conversion. In other words, during A/D conversion, switch $S_6$ is closed while switch $S_7$ is open for both the sampling and the hold periods. During D/A conversion, these two switches are reversed; i.e., $S_6$ is open and $S_7$ is closed, again, for both sampling and the hold periods. This permits the pipeline architecture to perform both A/D and D/A conversion without the need for additional components. The above described A/D and D/A conversion switching configuration is summarized in the Table below.

TABLE 2

Switching Configuration for the reversible
reduced gain 1-bit stage

| Phase | $S_1$ | $S_2$ | $S_3$ | $S_4$ | $S_5$ | $S_6$ | $S_7$ | $S_8$ | $S_9$ |
|---|---|---|---|---|---|---|---|---|---|
| A/D Sample | X | O | X | X | O | X | O | X | O |
| A/D Hold   | O | X | O | O | X | X | O | O | X |
| D/A Sample | X | X | O | O | X | O | X | O | X |
| D/A Hold   | O | O | X | X | O | O | X | X | O |

(X indicates closed switches and O indicates open switches.)

It should be noted that the capacitor C in this reduced gain stage is a small fraction, for example, approximately, 5% of the nominal capacitors $C_1$ and $C_2$.

For the A/D conversion, the charge balancing equation is given by the following expression.

$$\frac{Vres_{i-1} \cdot ((A+1) \cdot (C_1 + C) + C_2)}{AC_1} = \qquad(10)$$

$$Vres_i \cdot \frac{1+C_2}{C_1} - D_i \cdot Vref \frac{C_2}{C_1} - \frac{Q_{SW}}{C_1}$$

For the D/A conversion, the charge balancing equation becomes the following.

$$Vres \cdot \left(\frac{(A+1)}{A} \cdot (C_1 + C_2) - \frac{C}{A}\right) = \qquad(11)$$

$$Vres_{i-1} \cdot (C_1 + C) + D_i Vref \cdot C_2 - Q_{SW}$$

As with the 1-bit stage of the present invention shown in FIG. 8, if the op amp open loop gain A is sufficiently large, the previous Equations (10) and (11) can be reduced to the equivalent relation as shown by the following equation.

$$Vres_i \times (C_1 + C_2) = Vres_{i-1} \times (C_1 + C_2) + D_i \times Vref \times C_2 \pm Q_{SW} \qquad(12)$$

Again, the charge injection error $Q_{SW}$ is not cancelled, but the net effect is equivalent to an overall offset which does not affect the linearity of the converting stage, and further, which can be calibrated as explained above.

Figure 10:
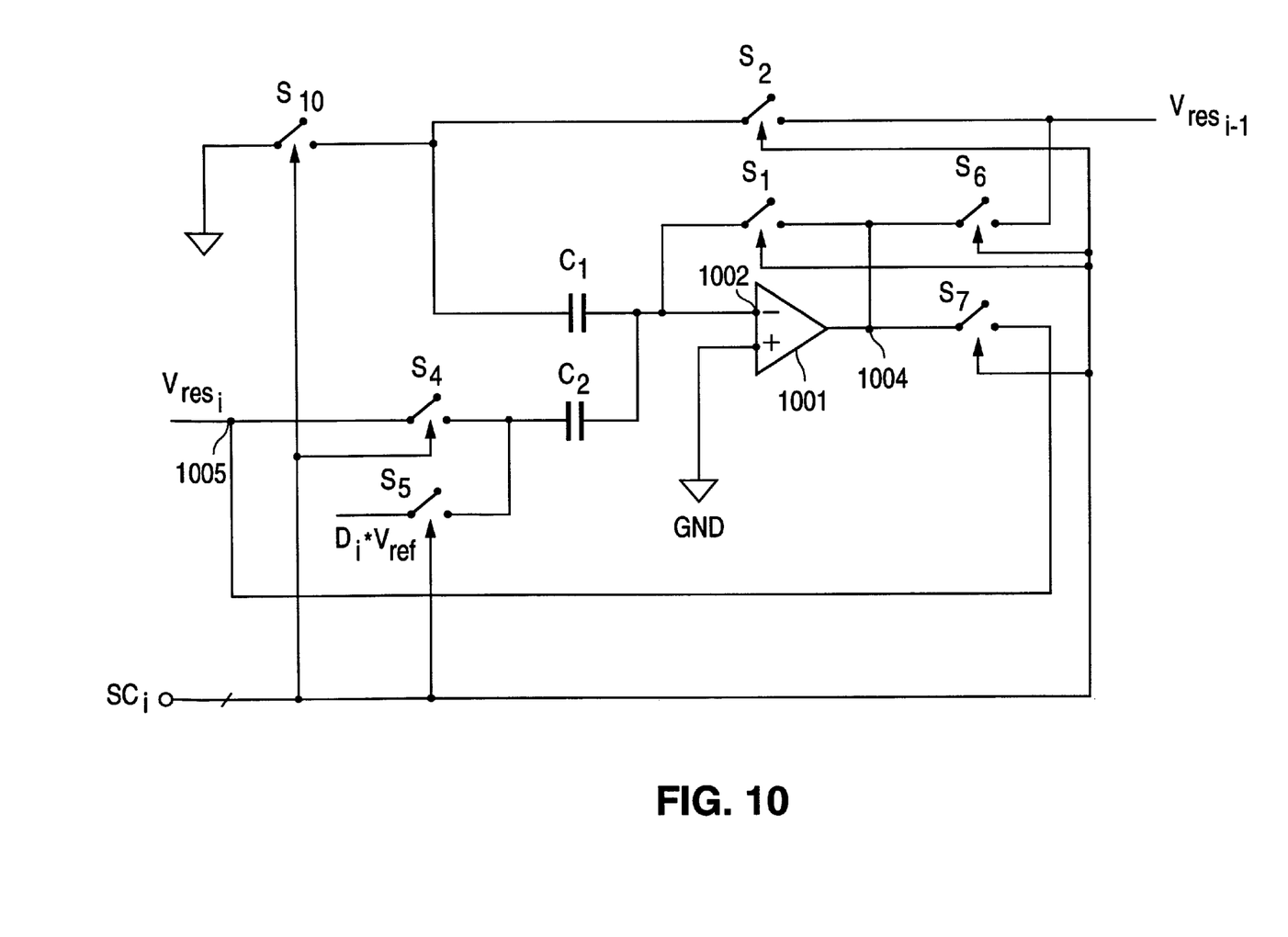
FIG. 10 illustrates an overflow reduction stage of a reversible A/D converter architecture according to the present invention.

FIG. 10 illustrates an embodiment of the present invention showing a reversible overflow reduction stage. The capacitor $C_2$ has a nominal value twice as large as capacitor $C_1$. Again, the switching configuration during the A/D conversion and the D/A conversion is similar to that of the first and second embodiments shown in FIGS. 8 and 9 respectively.

During the sampling period for A/D conversion, switches $S_1$, $S_{10}$, $S_4$, and $S_6$ are closed while switches $S_2$, $S_5$, and $S_7$ are open. This configuration permits input residue signal $Vres_i$ to be sampled across capacitor $C_2$ while the input node 1002 of the amplifier 1001 is coupled to the output node 1004. Furthermore, capacitor $C_1$ is now coupled between a common ground GND and the input node 1002 of the amplifier 1001. On the other hand, during the hold period, switches $S_2$, $S_5$, and $S_6$ are closed while switches $S_1$, $S_{10}$, $S_4$, and $S_7$ are open.

For D/A conversion, the switches are closed and open in the following manner. During the sampling period, switches $S_1$, $S_2$, $S_5$, and $S_7$ are closed while switches $S_{10}$, $S_4$, and $S_6$ are open. During the hold period for D/A conversion, switches $S_{10}$, $S_4$, and $S_7$ are closed while switches $S_1$, $S_2$, $S_5$, and $S_6$ are open. This configuration couples the capacitor $C_2$ between i-th stage input port 1005 and the input node 1002 of the amplifier 1001 while the capacitor $C_1$ is coupled between the common ground GND and the input node 1002 of the amplifier 1001. The above described switching sequence is summarized in Table 3 below.

TABLE 3

Switching Configuration for the 1-bit stage
with reversible overflow reduction

| Phase | $S_1$ | $S_2$ | $S_3$ | $S_4$ | $S_5$ | $S_6$ | $S_7$ |
|---|---|---|---|---|---|---|---|
| A/D Sample | X | O | X | X | O | X | O |
| A/D Hold   | O | X | O | O | X | X | O |
| D/A Sample | X | X | O | O | X | O | X |
| D/A Hold   | O | O | X | X | O | O | X |

(X indicates closed switches and O indicates open switches.)

For the A/D conversion, the charge balancing equation is given by the following expression.

$$\frac{Vres_{i-1} \cdot (A+1) \cdot (C_1 + C_2)}{AC_1} = Vres_i \cdot \frac{C_2}{C_1} - D_i \cdot Vref \frac{C_2}{C_1} - \frac{Q_{SW}}{C_1} \qquad(13)$$

For the D/A conversion, the charge balancing equation can be expressed by the following expression.

$$Vres \cdot \left(C_2 + \frac{(C_1 + C_2)}{A}\right) = Vres_{i-1} C_1 + D_i Vref \cdot C_2 - Q_{SW} \qquad(14)$$

Again, for a large op amp open loop gain, Equations (13) and (14) can be simplified to the equivalent relation as illustrated by the following expression.

$$Vres_i \times C_2 = Vref_{i-1} \times C_1 + D_i \times Vref \times C_2 \pm Q_{SW} \qquad(15)$$

The same considerations apply for the charge injection errors as described above. Furthermore, this reversible technique can be easily generalized to analog computation stages with more than 1 bit/stage.

In the embodiments illustrated above with references to FIGS. 8, 9 and 10, the various switches Si are controlled by a plurality of switch logic control signals SCi provided by a switch logic control circuit. Moreover, the switch control in all of the above-described embodiments can be implemented with transmission gates, pass gates and the like.

Figure 11:
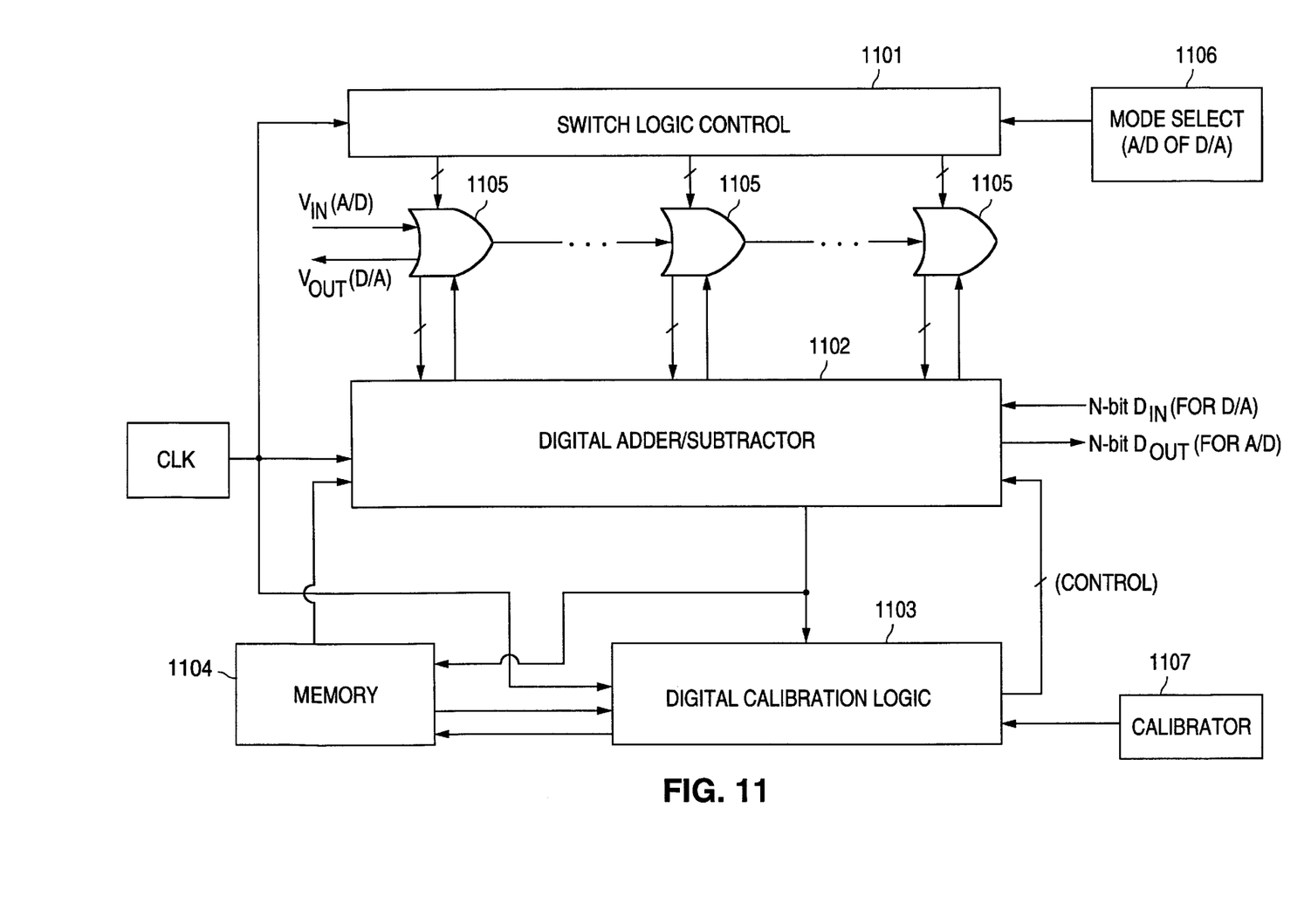
FIG. 11 illustrates a block diagram of a self-calibrating reversible A/D and D/A converter architecture according to the present invention.

FIG. 11 illustrates the self-calibrating reversible pipeline A/D and D/A converter architecture according to the present invention. As shown, a switch logic control 1101 operates in accordance with a mode select 1106 which determines whether analog to digital conversion or digital to analog conversion would take place. With the digital bit representation of the input signal from each stage 1105, a digital adder/subtractor 1102 and digital calibration logic 1103 operate to calibrate the pipeline architecture in accordance with the plurality of correction coefficients $CC_i$ and the global offset error Offset, both of which are stored in the memory 1104, during both the A/D and the D/A conversions. It should be noted that the digital calibration logic 1103 is calibrated by a calibrate switch 1107 which is done once at the power on. The switch logic control 1101, the digital adder/subtractor 1102 and the digital calibration logic 1103 are synchronized by a clock CLK.

Accordingly, as described above, the present invention illustrates a pipeline A/D converter architecture that is capable of converting a signal from digital to analog form. Furthermore, according to the present invention, the D/A conversion using the same A/D converter architecture can be achieved using the same digital correction coefficients. Also, the architecture herein disclosed is capable of self-calibration which further simplifies the converter architecture.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of generating a plurality of digital bits representing a digital signal in digital to analog conversion for use in a reversible analog to digital and digital to analog converter, said method comprising the steps of:

initializing a digital signal; and comparing said digital signal with a coefficient such that for each stage of a reversible converter architecture, a digital bit corresponding to said stage is set to 1 and a global offset is subtracted from said digital signal when said digital signal is larger than said correction coefficient, and further, wherein said digital bit corresponding to said stage is set to 0 when said digital signal is smaller than said correction coefficient.

2. The method of claim 1 wherein said coefficient comprises a plurality of data generated during analog to digital conversion and stored in a memory.

3. The method of claim 1 wherein said step of initializing said digital signal comprises adding said global offset to said digital signal.

4. An apparatus including a converter circuit for use in a self-calibrating reversible analog to digital and digital to analog converter, said converter circuit comprising:

an amplifier;

a plurality of capacitances coupled to said amplifier;

a first reference signal port configured to receive a first reference signal;

a first signal port configured to receive an analog signal;

a second signal port configured to receive a digital signal;

a plurality of switches configured to receive a plurality of switch control signals which includes first and second switch control signal states and in accordance therewith selectively couple said amplifier, said plurality of capacitances, said first reference signal port and said first and second signal ports; and a second reference signal port configured to receive a second reference signal;

wherein during said first switch control signal state said analog signal is converted to said digital signal and during said second switch control signal state said digital signal is converted to said analog signal;

wherein said plurality of switches is further configured to selectively couple said second reference signal port to one of said plurality of capacitances in accordance with said plurality of switch control signals; and further wherein said plurality of capacitances includes first and second capacitances and said first capacitance is a fraction of said second capacitance.

5. The apparatus of claim 4 further comprising a switch control circuit configured to generate said plurality of switch control signals.

6. The apparatus of claim 5 further comprising:

a calibration circuit configured to calibrate said apparatus and in accordance therewith generating a plurality of coefficients; and a memory configured to store said plurality of coefficients;

wherein said switch logic control circuit selectively accesses said memory for retrieving at least a portion of said plurality of coefficients from said memory.

7. The apparatus of claim 6 wherein said memory is a random access memory.

8. The apparatus of claim 4 wherein said plurality of switches comprises a plurality of transmission gates.

* * * * *